United States Patent
Chen

(10) Patent No.: US 11,062,932 B2
(45) Date of Patent: Jul. 13, 2021

(54) METHOD OF TRANSFERRING MICRO DEVICES

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/706,775

(22) Filed: Dec. 8, 2019

(65) Prior Publication Data

US 2021/0175111 A1 Jun. 10, 2021

(51) Int. Cl.
*H01L 21/683* (2006.01)
*H01L 25/075* (2006.01)
*H01L 33/62* (2010.01)

(52) U.S. Cl.
CPC ...... *H01L 21/6835* (2013.01); *H01L 25/0753* (2013.01); *H01L 33/62* (2013.01); *H01L 2221/68354* (2013.01); *H01L 2221/68363* (2013.01); *H01L 2933/0066* (2013.01)

(58) Field of Classification Search
CPC . H01L 21/6835; H01L 25/0753; H01L 33/62; H01L 2221/68354; H01L 2221/68363; H01L 2933/0066
USPC ......................................................... 438/28
See application file for complete search history.

(56) References Cited

U.S. PATENT DOCUMENTS 10,516,081 B1* 12/2019 Xin ........................ H01L 33/24
2019/0096846 A1* 3/2019 Bibl ........................ H01L 24/83

* cited by examiner

*Primary Examiner* — Vu A Vu
(74) *Attorney, Agent, or Firm* — CKC & Partners Co., LLC

(57) ABSTRACT

A method of transferring a plurality of micro devices is provided. The method includes: arranging the micro devices on a carrier substrate in a hexagonal manner; arranging a plurality of pick-up portions of a transfer head in a rectangular manner; and picking up the micro devices from the carrier substrate by the pick-up portions.

10 Claims, 6 Drawing Sheets

METHOD OF TRANSFERRING MICRO DEVICES

BACKGROUND

Field of Invention

The present disclosure relates to a method of transferring a plurality of micro devices.

Description of Related Art

The statements in this section merely provide background information related to the present disclosure and do not necessarily constitute prior art.

Traditional technologies for the transfer of devices include transferring from a transfer wafer to a receiving substrate by wafer bonding. One such implementation is "direct bonding" which involves one bonding stage of an array of devices from a transfer wafer to a receiving substrate, followed by removal of the transfer wafer. Another such implementation is "indirect bonding" which involves two bonding/de-bonding stages. In indirect bonding, a transfer head may pick up an array of devices from a donor substrate, and then bond the array of devices to a receiving substrate, followed by removal of the transfer head.

In recent years, many researchers and experts have been working hard to overcome those difficulties in making a massive transfer of devices (i.e., transferring millions or tens of millions of devices) feasible for commercial applications. Among those difficulties, how to achieve cost reduction, time efficiency, and yield are three of the key issues in the industry.

SUMMARY

According to some embodiments of the present disclosure, a method of transferring a micro device is provided. The method includes: arranging the micro devices on a carrier substrate in a hexagonal manner; arranging a plurality of pick-up portions of a transfer head in a rectangular manner; and picking up the micro devices from the carrier substrate by the pick-up portions.

It is to be understood that both the foregoing general description and the following detailed description are by examples, and are intended to provide further explanation of the present disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
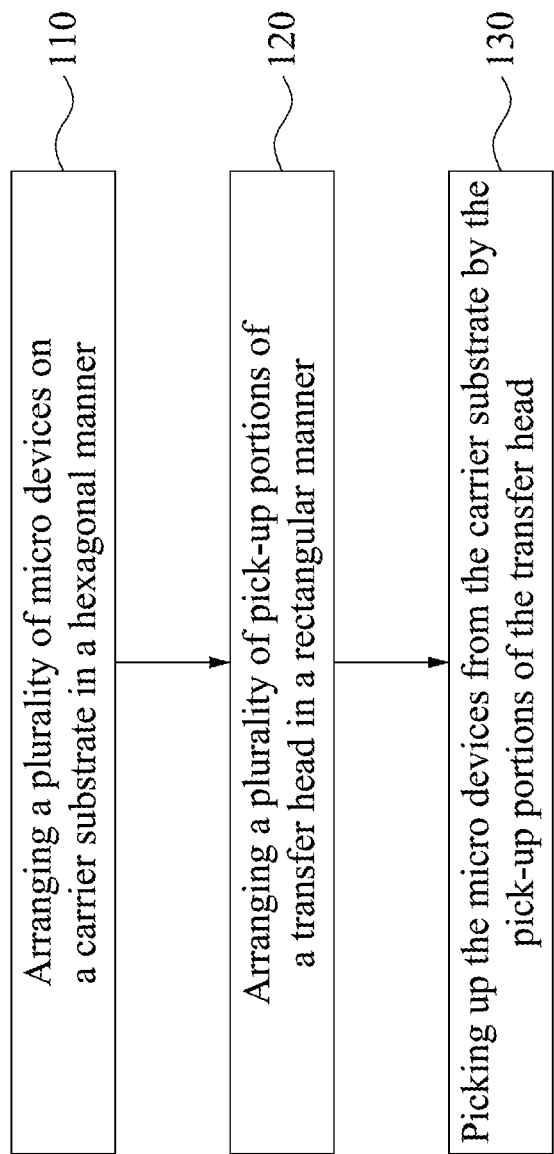
FIG. 1 is a flow chart of a method of transferring a plurality of micro devices according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 2:
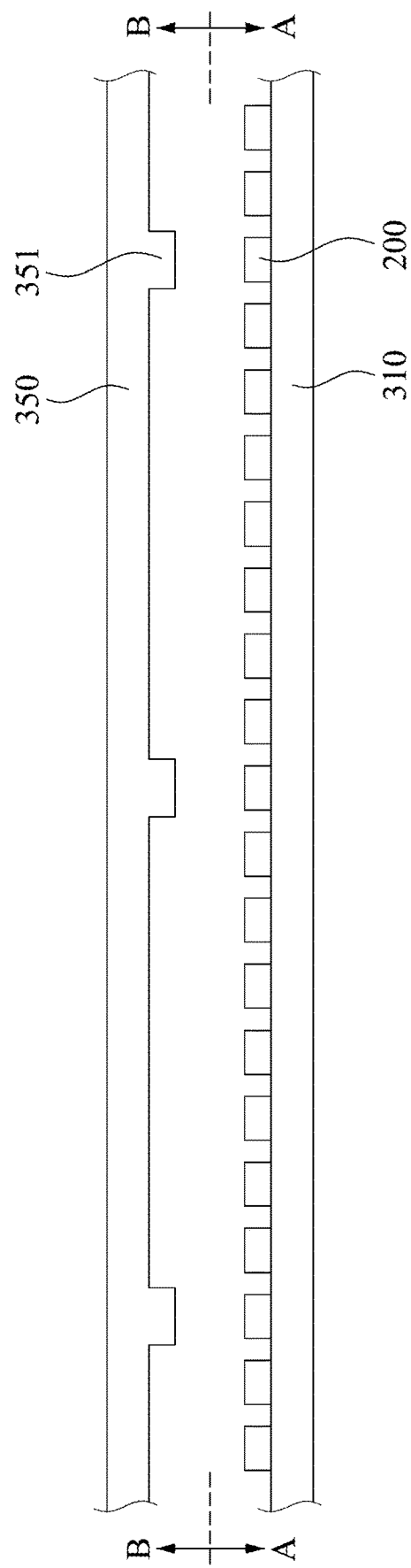
FIG. 2 is a schematic cross-sectional view of an intermediate stage of the method illustrated by FIG. 1 according to some embodiments of the present disclosure.
Figure 3:
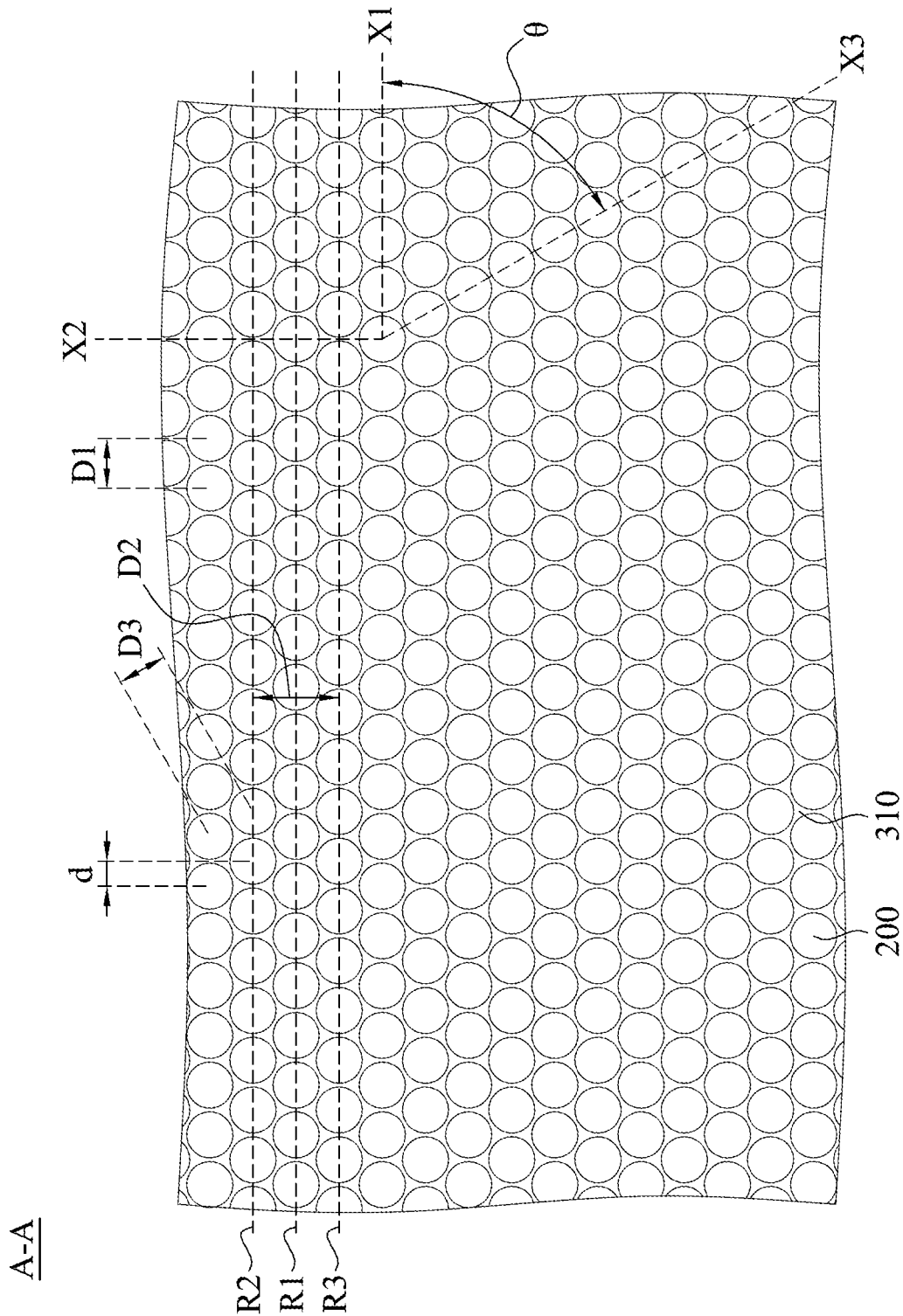
FIG. 3 is a sectional view along the section line A-A of FIG. 2 according to some embodiments of the present disclosure.

Reference is made to FIG. 1. FIG. 1 is a flow chart of a method 100 of handling a plurality of micro devices (e.g., micro devices 200 as shown in FIG. 2) according to some embodiments of the present disclosure. In some embodiments, the method 100 of handling a plurality of micro devices is provided. As shown in FIG. 1, with reference to FIGS. 2-6, the handling method 100 of the embodiment includes the following operations (it is appreciated that the sequence of the operations and the sub-operations as mentioned below, unless otherwise specified, can all be adjusted upon the actual needs, or even executed at the same time or partially at the same time):

(1) Arranging the micro devices 200 on a carrier substrate 310 in a hexagonal manner. (Operation 110, as illustrated by FIG. 3)

Figure 4:
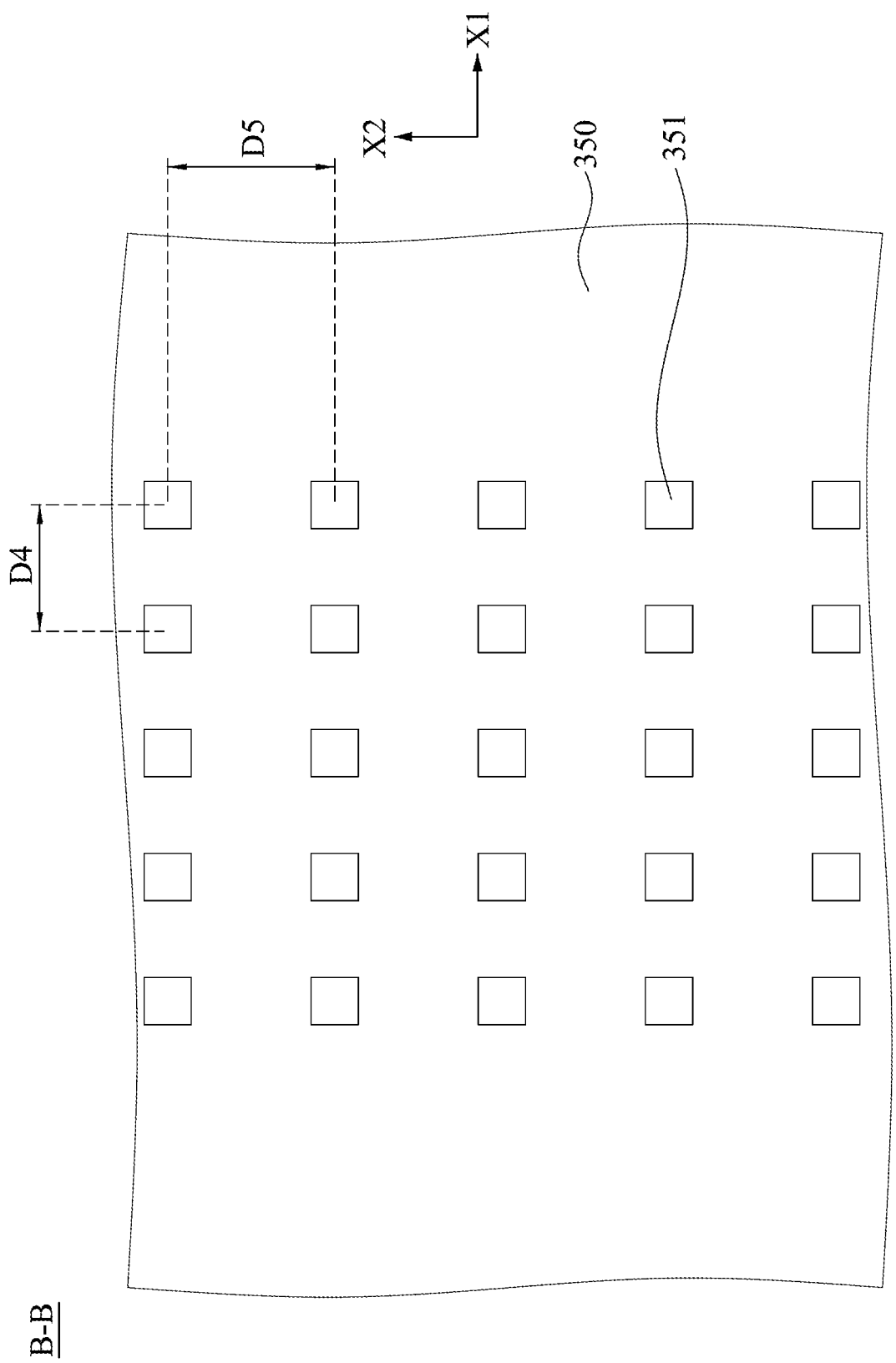
FIG. 4 is a sectional view along the section line B-B of FIG. 2 according to some embodiments of the present disclosure.

(2) Arranging a plurality of pick-up portions 351 of a transfer head 350 in a rectangular manner. (Operation 120, as illustrated by FIG. 4)

Figure 6:
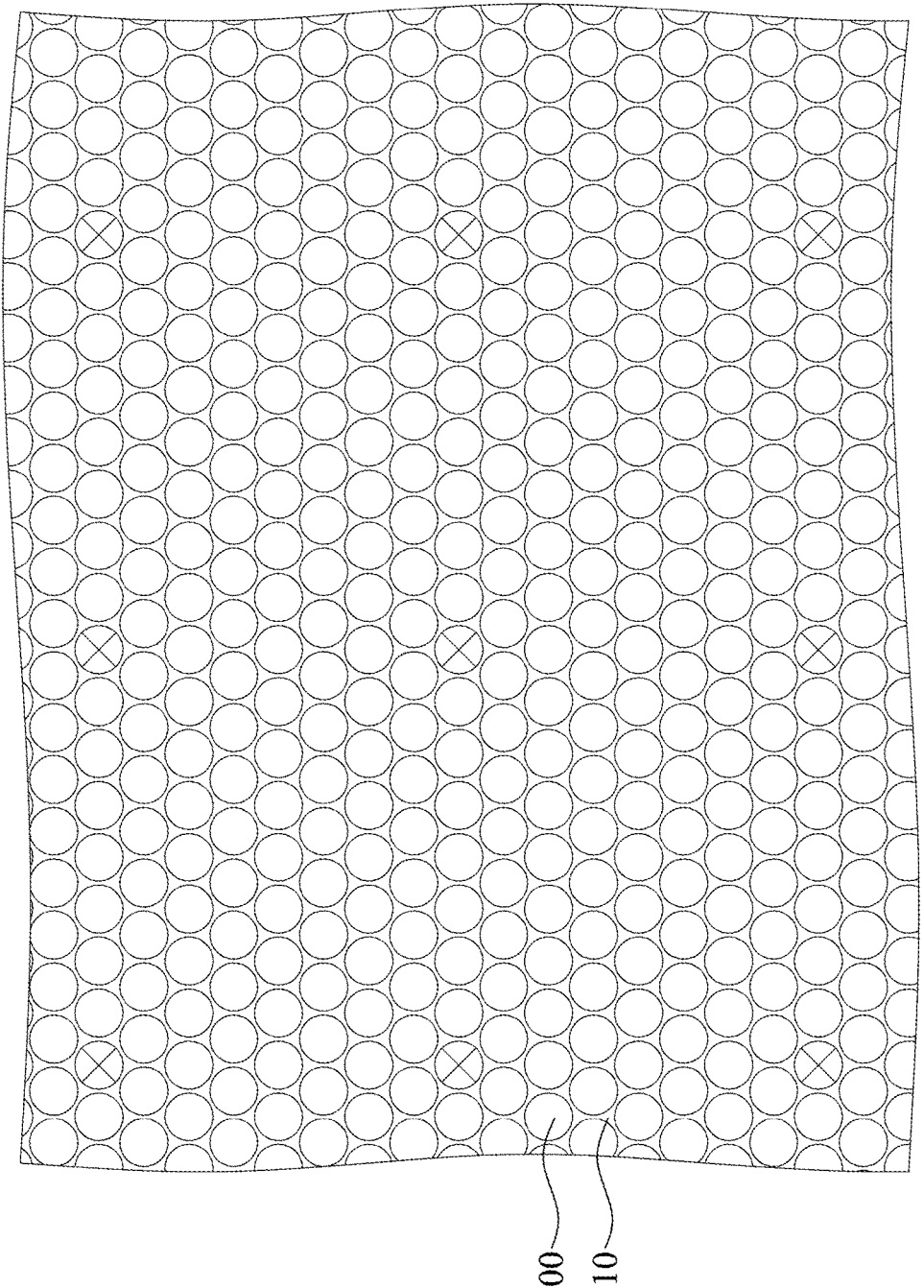
FIG. 6 is a sectional view along the section line C-C of FIG. 5 according to some embodiments of the present disclosure.

(3) Picking up the micro devices 200 from the carrier substrate 310 by the pick-up portions 351 of the transfer head 350. (Operation 130, as illustrated by FIG. 6)

Reference is made to FIG. 2. FIG. 2 is a schematic cross-sectional view of an intermediate stage of the method 100 illustrated by FIG. 1 according to some embodiments of the present disclosure. In some embodiments, as shown in FIG. 2, the micro devices 200 are disposed on the carrier substrate 310. The transfer head 350 is located above the carrier substrate 310. The transfer head 350 is configured to pick up the micro devices 200 from the carrier substrate 310.

Reference is made to FIG. 3. FIG. 3 is a sectional view along the section line A-A of FIG. 2 according to some embodiments of the present disclosure. FIG. 3 is in fact a top view of the carrier substrate 310 disposed with the micro devices 200 thereon. In some embodiments, as shown in FIG. 3, the micro devices 200 are arranged on the carrier substrate 310 in a hexagonal manner, which is the operation 110 of the method 100. The hexagonal manner refers to the configuration that each of the micro devices 200 is evenly surrounded by six of the micro devices 200.

To be specific, as shown in FIG. 3, the micro devices 200 are arranged in rows. Each of the rows extends along a first direction X1. The micro devices 200 in each of the rows sandwiched between adjacent two of the rows is shifted along the first direction X1 by a distance d relative to the micro devices 200 in the two said rows. Without loss of generality, taking the row R1 of the micro devices 200 in FIG. 3 as an example. The row R1 is sandwiched between the row R2 and row R3. The micro devices 200 in the row R1 are shifted by the distance d along the first direction X1 relative to the micro devices 200 in the row R2 and row R3. Furthermore, the micro devices 200 in the row R2 and the row R3 align with each other along a second direction X2. The second direction X2 is perpendicular to the first direction X1. In other words, each of the micro devices 200 in the row R2 is aligned in a straight line with the corresponding micro device 200 in the row R3 along the second direction X2.

Furthermore, each of the micro devices 200 is regularly separated from the adjacent micro device 200 aligned along the first direction X1 by a distance D1. In other words, the distances between any adjacent two of the micro devices 200 along the first direction X1 are the same and equal to the distance D1. To be specific, the distance D1 is measured from the centers of any adjacent two of the micro devices 200 aligned along the first direction X1. Practically, the distance D1 is substantially double the distance d, in order to optimize the spatial use of the carrier substrate 310.

On the other hand, each of the micro devices 200 is regularly separated from the adjacent micro device 200 aligned along the second direction X2 by a distance D2. In other words, the distances between any adjacent two of the micro devices 200 along the second direction X2 are the same and equal to the distance D2. Similarly, to be specific, the distance D2 is measured from the centers of any adjacent two of the micro devices 200 aligned along the second direction X2.

Geometrically speaking, in addition, the micro devices 200 are arranged and aligned along a third direction X3. The third direction X3 intersects with the first direction X1 at an angle θ. In some embodiments, the angle θ between the first direction X1 and the third direction X3 is 60 degrees.

Furthermore, each of the micro devices 200 is regularly separated from the adjacent micro device 200 aligned along the third direction X3 by a distance D3. In other words, the distances between any adjacent two of the micro devices 200 along the third direction X3 are the same and equal to the distance D3. Similarly, to be specific, the distance D3 is measured from the centers of any adjacent two of the micro devices 200 aligned along the third direction X3. Practically, the distance D3 is substantially equal to the distance D1.

Therefore, provided that the angle θ between the first direction X1 and the third direction X3 is 60 degrees, the distance D2 is geometrically equal to double the distance D1 times cosine 60 degrees, such that ratio of the distance D2 to the distance D1 is approximately equal to 1.73.

Therefore, the micro devices 200 are regularly arranged on the carrier substrate 310 in a hexagonal manner. In this way, the quantity of the micro devices 200 which can be disposed on the carrier substrate 310 can be maximized, facilitating the improvement of efficiency of the handling process for the micro devices 200.

In some embodiments, the micro devices 200 are microscopic light emitting diodes (micro-LEDs), which do not intend to limit the present disclosure. Moreover, each of the micro-LEDs 200 is circular in shape when viewed from the top or from the transfer head 350, such that a tight hexagonal arrangement of the micro-LEDs 200 can be formed and the quantity of the micro-LEDs 200 which can be disposed on the carrier substrate 310 can be maximized, facilitating the improvement of efficiency of the handling process for the micro-LEDs 200. However, this circular shape of each of the micro-LEDs 200 does not intend to limit the present disclosure. For example, according to the actual situation, each of the micro-LEDs 200 can be of a rectangular shape or a polygonal shape such as a hexagon or an octagon.

Reference is made to FIG. 4. FIG. 4 is a sectional view along the section line B-B of FIG. 2 according to some embodiments of the present disclosure. FIG. 4 is in fact a bottom view of the transfer head 350 disposed with the pick-up portions 351. In some embodiments, as shown in FIG. 4, the pick-up portions 351 are arranged on the transfer head 350 in a rectangular manner, which is the operation 120 of the method 100.

To be specific, the pick-up portions 351 are arranged regularly along the first direction X1 and along the second direction X2 on the transfer head 350, in which the first direction X1 and the second direction X2 are perpendicular to each other.

Furthermore, each of the pick-up portions 351 is regularly separated from the adjacent pick-up portions 351 aligned along the first direction X1 by a distance D4. In other words, the distances between any adjacent two of the pick-up portions 351 along the first direction X1 are the same and equal to the distance D4. Similarly, to be specific, the distance D4 is measured from the centers of any adjacent two of the pick-up portions 351 aligned along the first direction X1. It is worth to note that, in some embodiments, the distance D4 between any adjacent two of the pick-up portions 351 of the transfer head 350 along the first direction X1 is substantially an integer multiple of the distance D1 between any adjacent two of the micro devices 200 on the carrier substrate 310 along the first direction X1. In practical applications, the integer multiple of the distance D4 to the distance D1 is in a range from about 7 to about 20. For example, the distance D4 between any adjacent two of the pick-up portions 351 of the transfer head 350 along the first direction X1 can be about 7, 10, 13, 16, 19 or 20 times more than the distance D1 between any adjacent two of the micro devices 200 on the carrier substrate 310 along the first direction X1.

Similarly, each of the pick-up portions 351 is regularly separated from the adjacent pick-up portions 351 aligned along the second direction X2 by a distance D5. In other words, the distances between any adjacent two of the pick-up portions 351 along the second direction X2 are the same and equal to the distance D5. Similarly, to be specific, the distance D5 is measured from the centers of any adjacent two of the pick-up portions 351 aligned along the second direction X2. It is worth to note that, in some embodiments, the distance D5 between any adjacent two of the pick-up portions 351 of the transfer head 350 along the second direction X2 is substantially an integer multiple of the distance D2 between any adjacent two of the micro devices 200 on the carrier substrate 310 along the second direction X2. In practical applications, the integer multiple of the distance D5 to the distance D2 is in a range from about 7 to about 20. For example, the distance D5 between any adjacent two of the pick-up portions 351 of the transfer head 350 along the second direction X2 can be about 7, 10, 13, 16, 19 or 20 times more than the distance D2 between any adjacent two of the micro devices 200 on the carrier substrate 310 along the second direction X2.

Moreover, with regard to the regular arrangement of the micro devices 200 on the carrier substrate 310 in a hexagonal manner, in some embodiments, the ratio of the distance D5 to the distance D4 can be designed to be about 1.73. That is, the distance D5 between any adjacent two of the pick-up portions 351 of the transfer head 350 along the second direction X2 can be designed to be about 1.73 times of the distance D4 between any adjacent two of the pick-up portions 351 of the transfer head 350 along the first direction X1. In this way, the ratio of the distance D5 to the distance D4 is the same as the ratio of the distance D2 to the distance D1 as mentioned above.

Figure 5:
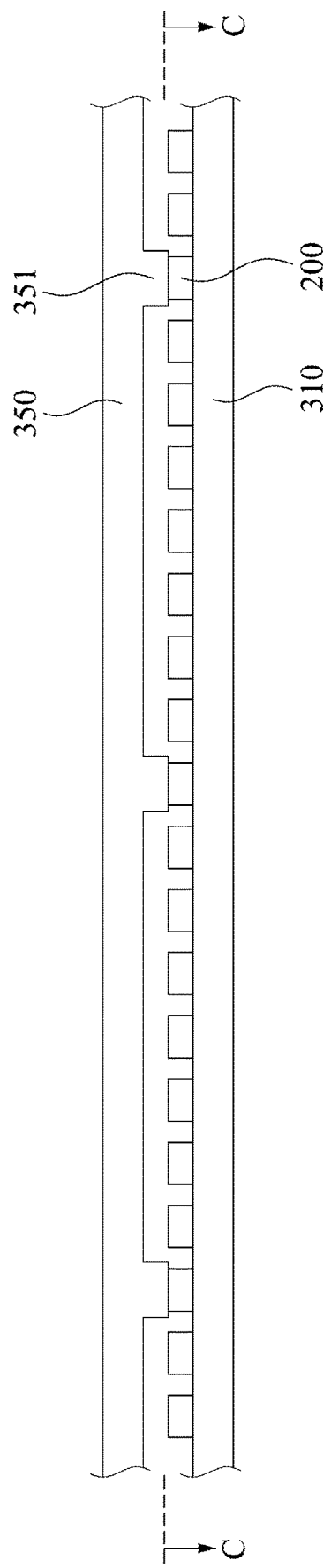
FIG. 5 is a schematic cross-sectional view of an intermediate stage of the method illustrated by FIG. 1 according to some embodiments of the present disclosure.

Reference is made to FIG. 5. FIG. 5 is a schematic cross-sectional view of an intermediate stage of the method 100 illustrated by FIG. 1 according to some embodiments of the present disclosure. In some embodiments, as shown in FIG. 5, the transfer head 350 moves towards the carrier substrate 310 and the pick-up portions 351 of the transfer head 350 are in contact with the micro devices 200 on the carrier substrate 310. At this point, the pick-up portions 351 of the transfer head 350 are ready to pick up the micro devices 200, which is the operation 130 of the method 100. For the sake of easy understanding, the micro devices 200 shown in FIG. 5 can be understood as aligning along the first direction X1 or the second direction X2.

As mentioned above, the distance D4 between any adjacent two of the pick-up portions 351 of the transfer head 350 along the first direction X1 is substantially an integer multiple of the distance D1 between any adjacent two of the micro devices 200 on the carrier substrate 310 along the first direction X1. In this way, when the pick-up portions 351 of the transfer head 350 are in contact with the micro devices 200 on the carrier substrate 310, each of the pick-up portions 351 will be able to substantially align with the corresponding micro device 200, achieving a proper pick up of the micro devices 200 from the carrier substrate 310.

Similarly, the distance D5 between any adjacent two of the pick-up portions 351 of the transfer head 350 along the second direction X2 is substantially an integer multiple of the distance D2 between any adjacent two of the micro devices 200 on the carrier substrate 310 along the second direction X2. In this way, when the pick-up portions 351 of the transfer head 350 are in contact with the micro devices 200 on the carrier substrate 310, each of the pick-up portions 351 will be able to substantially align with the corresponding micro device 200, achieving a proper pick up of the micro devices 200 from the carrier substrate 310.

Reference is made to FIG. 6. FIG. 6 is a sectional view along the section line C-C of FIG. 5 according to some embodiments of the present disclosure. FIG. 6 is in fact a top view of the carrier substrate 310 which shows the micro devices 200 to be picked up by the transfer head 350. Each of the micro devices 200 to be picked up by the transfer head 350 is marked with a cross. It is noted that the micro devices 200 marked with a cross are arranged in a rectangular manner. In some embodiments, the micro devices 200 arranged on the carrier substrate 310 in a hexagonal manner are picked up in a rectangular manner by the transfer head 350, as shown in FIG. 6.

In summary, the embodiments of the present disclosure provide a method of transferring a plurality of micro devices in which the micro devices are first arranged on the carrier substrate in a hexagonal manner such that the quantity of the micro devices disposed on the carrier substrate is maximized. As such, the transfer head with the pick-up portions arranged in a rectangular manner is used to pick up the micro devices. Moreover, each of the pick-up portions is able to substantially align with the corresponding micro device on the carrier substrate, achieving a proper pick up of the micro devices from the carrier substrate.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of transferring a plurality of micro devices, comprising:
    arranging the micro devices on a carrier substrate in a hexagonal manner;
    arranging a plurality of pick-up portions of a transfer head in a rectangular manner; and
    picking up the micro devices from the carrier substrate by the pick-up portions,
    wherein the micro devices are microscopic light emitting diodes (micro-LEDs) and each of the micro-LEDs is circular in shape.

2. The method of claim 1, wherein the micro devices are arranged in rows, each of the rows extends along a first direction, the micro devices in each of the rows sandwiched between adjacent two of the rows of the micro devices is shifted along the first direction by a distance relative to the micro devices in the two said rows, and the micro devices in the two said rows align with each other along a second direction perpendicular to the first direction.

3. The method of claim 2, wherein the micro devices are arranged along a third direction intersecting at 60 degrees with the first direction.

4. The method of claim 3, wherein distances between any adjacent two of the micro devices along the third direction are the same.

5. The method of claim 2, wherein the pick-up portions are arranged along the first direction and the second direction.

6. The method of claim 5, wherein a distance between any adjacent two of the pick-up portions along the first direction is an integer multiple of a distance between any adjacent two of the micro devices along the first direction.

7. The method of claim 6, wherein the integer multiple is in a range from about 7 to about 20.

8. The method of claim 5, wherein a distance between any adjacent two of the pick-up portions along the second direction is an integer multiple of a distance between any adjacent two of the micro devices along the second direction.

9. The method of claim 8, wherein the integer multiple is in a range from about 7 to about 20.

10. The method of claim 2, wherein distances between any adjacent two of the micro devices along the first direction are the same.

* * * * *